(12) United States Patent
Zhang et al.

(10) Patent No.: US 12,294,385 B1
(45) Date of Patent: May 6, 2025

(54) BIT-FLIPPING DECODER AND DECODING METHOD BASED ON SUPER NODE

(71) Applicant: SK hynix Inc., Gyeonggi-do (KR)

(72) Inventors: Fan Zhang, San Jose, CA (US); Meysam Asadi, San Jose, CA (US); Qiuju Diao, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/490,051

(22) Filed: Oct. 19, 2023

(51) Int. Cl.
*H03M 13/11* (2006.01)
*H03M 13/00* (2006.01)
*H03M 13/37* (2006.01)

(52) U.S. Cl.
CPC ... *H03M 13/1108* (2013.01); *H03M 13/3746* (2013.01)

(58) Field of Classification Search
CPC ......... H03M 13/1108; H03M 13/3746; H03M 13/00; H03M 13/1575; H03M 13/1177; H03M 13/116; H03M 13/1111; H03M 13/096; H03M 13/3715; H03M 13/43; H03M 13/015; H03M 13/112; G06F 11/08
See application file for complete search history.

(56) References Cited

U.S. PATENT DOCUMENTS

| | | | | |
|---|---|---|---|---|
| 11,108,407 B1* | 8/2021 | Lu | ...... | H03M 13/1111 |
| 11,146,290 B1* | 10/2021 | Xiong | ...... | H03M 13/1111 |
| 11,381,253 B1* | 7/2022 | Asadi | ...... | H03M 13/1148 |
| 11,469,775 B2* | 10/2022 | Savin | ...... | H03M 13/1108 |
| 11,967,970 B2* | 4/2024 | Zhang | ...... | H03M 13/1108 |
| 2015/0381206 A1 | 12/2015 | Fainzilber et al. | | |
| 2021/0013905 A1 | 1/2021 | Xiong et al. | | |

* cited by examiner

*Primary Examiner* — Justin R Knapp
(74) *Attorney, Agent, or Firm* — IP & T GROUP LLP

(57) ABSTRACT

A bit-flipping (BF) decoder and a decoding method based on a super node, which groups two or more component nodes corresponding to two or more bits in a codeword to generate a super node; and performs a decoding iteration on the super node. The decoding iteration includes: calculating a flipping energy for the super node based on a flipping energy for each of the component nodes and internal checks between the component nodes; and flipping at least one of the two or more bits in the super node upon a determination that the flipping energy for the super node exceeds a bit-flipping threshold.

20 Claims, 9 Drawing Sheets

SUPER NODE BF DECODER 800

BIT-FLIPPING DECODER AND DECODING METHOD BASED ON SUPER NODE

BACKGROUND

1. Field

Embodiments of the present disclosure relate to decoding schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may use various types of decoders.

SUMMARY

Aspects of the present invention include a bit-flipping (BF) decoder and a decoding method based on a super node including two or more nodes.

In one aspect of the present invention, a method of operating a bit-flipping decoder includes: receiving a codeword; grouping two or more component nodes corresponding to two or more bits in the codeword to generate a super node; and performing a decoding iteration on the super node. The decoding iteration includes: calculating a flipping energy for the super node based on a flipping energy for each of the component nodes and internal checks between the component nodes; flipping at least one of the two or more bits in the super node upon a determination that the flipping energy for the super node exceeds a bit-flipping threshold; updating, subsequent to the flipping, a syndrome as a product of the codeword and a parity check matrix; and declaring a success of the decoding iteration upon a determination that the syndrome is zero.

In one aspect of the present invention, a method of operating a bit-flipping decoder includes: receiving a codeword; partitioning multiple component nodes corresponding to multiple bits in the codeword to generate multiple super nodes, each super node corresponding to two or more component nodes among the multiple component nodes, the two or more component nodes corresponding to two or more bits; and performing multiple super node decoding iterations on each super node. Each of the multiple super node decoding iterations includes: calculating a flipping energy for each super node based on a flipping energy for each of the two or more component nodes and internal checks between the two or more component nodes; flipping at least one of the two or more bits in each super node upon a determination that the flipping energy for each super node exceeds a bit-flipping threshold; updating, subsequent to the flipping, a syndrome as a product of the codeword and a parity check matrix; and declaring a success of the decoding iteration upon a determination that the syndrome is zero.

In another aspect of the present invention, a decoding system includes a processor and a memory including instructions stored thereupon. Wherein the instructions upon execution by the processor cause a bit-flipping decoder to: receive a codeword; group two or more component nodes corresponding to two or more bits in the codeword to generate a super node; and perform a decoding iteration on the super node. Wherein the decoding iteration includes: calculating a flipping energy for the super node based on a flipping energy for each of the component nodes and internal checks between the component nodes; flipping at least one of the two or more bits in the super node upon a determination that the flipping energy for the super node exceeds a bit-flipping threshold; updating, subsequent to the flipping, a syndrome as a product of the codeword and a parity check matrix; and declaring a success of the decoding iteration upon a determination that the syndrome is zero.

Additional aspects of the present invention will become apparent from the following description.

DETAILED DESCRIPTION

Figure 1:
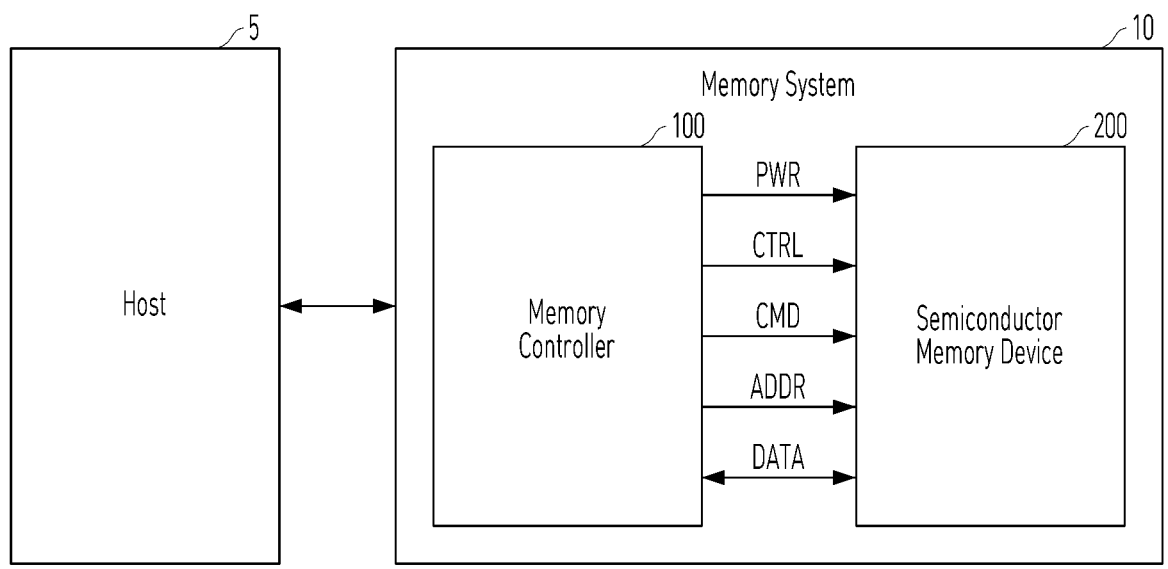
FIG. 1 is a block diagram illustrating a data processing system in accordance with one embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of the embodiments of the present invention is provided below along with accompanying figures that illustrate aspects of the present invention. The present invention is described in connection with such embodiments, but the present invention is not limited to any embodiment. The present invention encompasses numerous alternatives, modifications and equivalents. Numerous specific details are set forth in the following description in order to provide a thorough understanding of the present invention. These details are provided for the purpose of example; the present invention may be practiced without some or all of these specific details. For clarity, technical material that is known in technical fields related to the present invention may not been described in detail.

FIG. 1 is a block diagram illustrating a data processing system 2 in accordance with one embodiment of the present invention.

Referring to FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
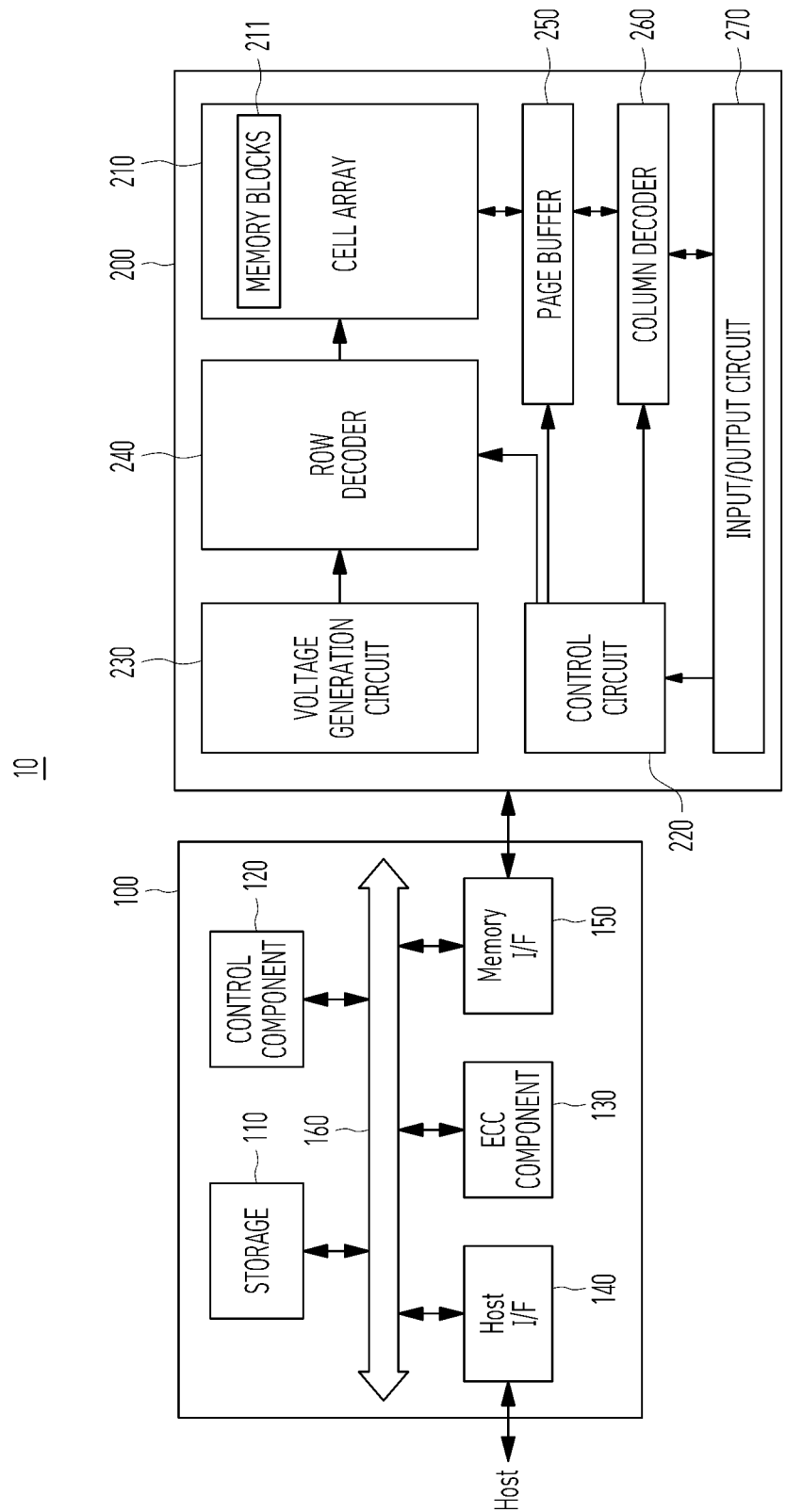
FIG. 2 is a block diagram illustrating a memory system in accordance with another embodiment of the present invention.

FIG. 2 is a block diagram illustrating a memory system in accordance with another embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120 which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200 in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various communication standards or interfaces such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
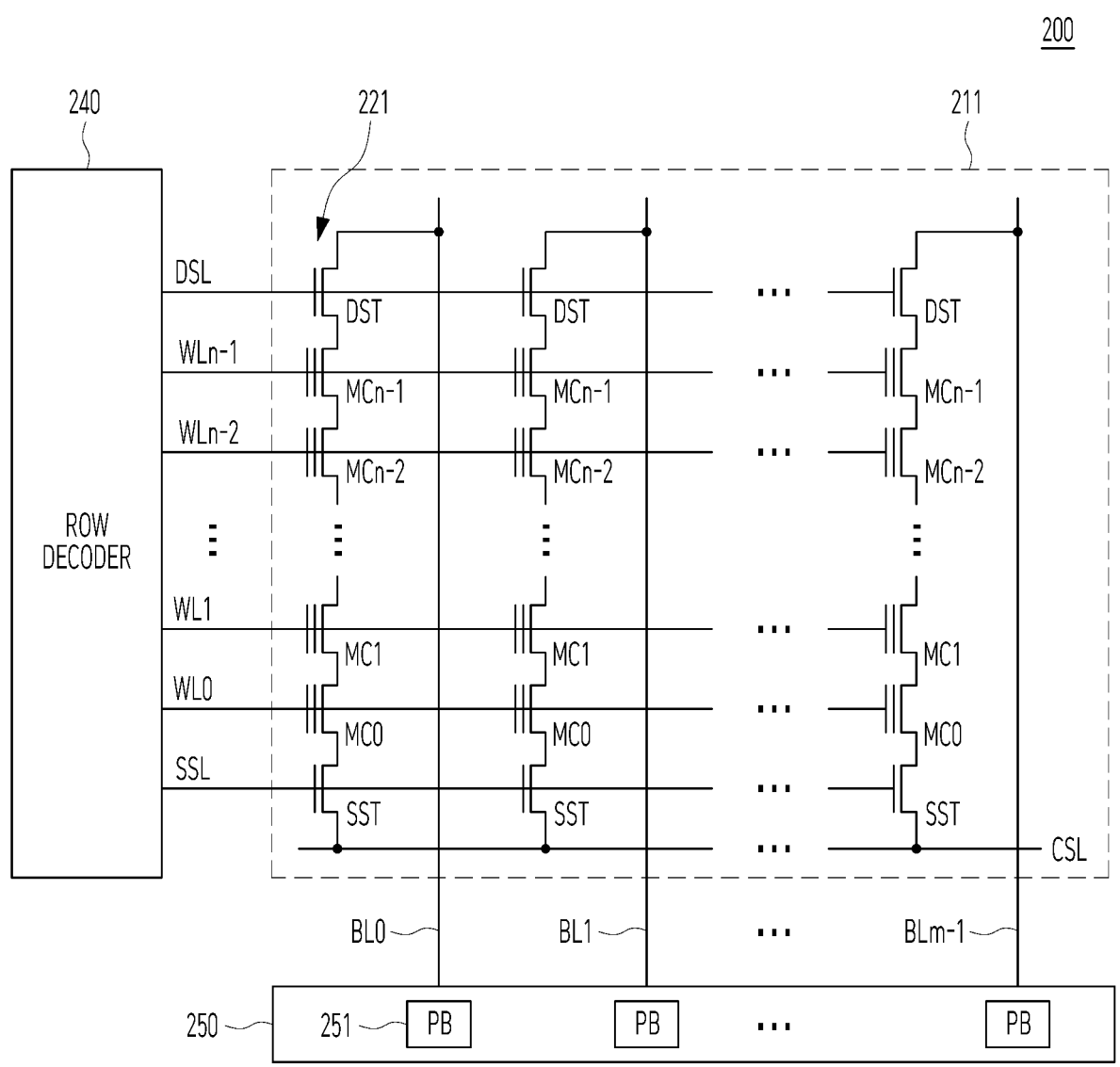
FIG. 3 is a circuit diagram illustrating a memory block of a memory device in accordance with another embodiment of the present invention.

The page buffer 250 may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 may transmit data to and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn-1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
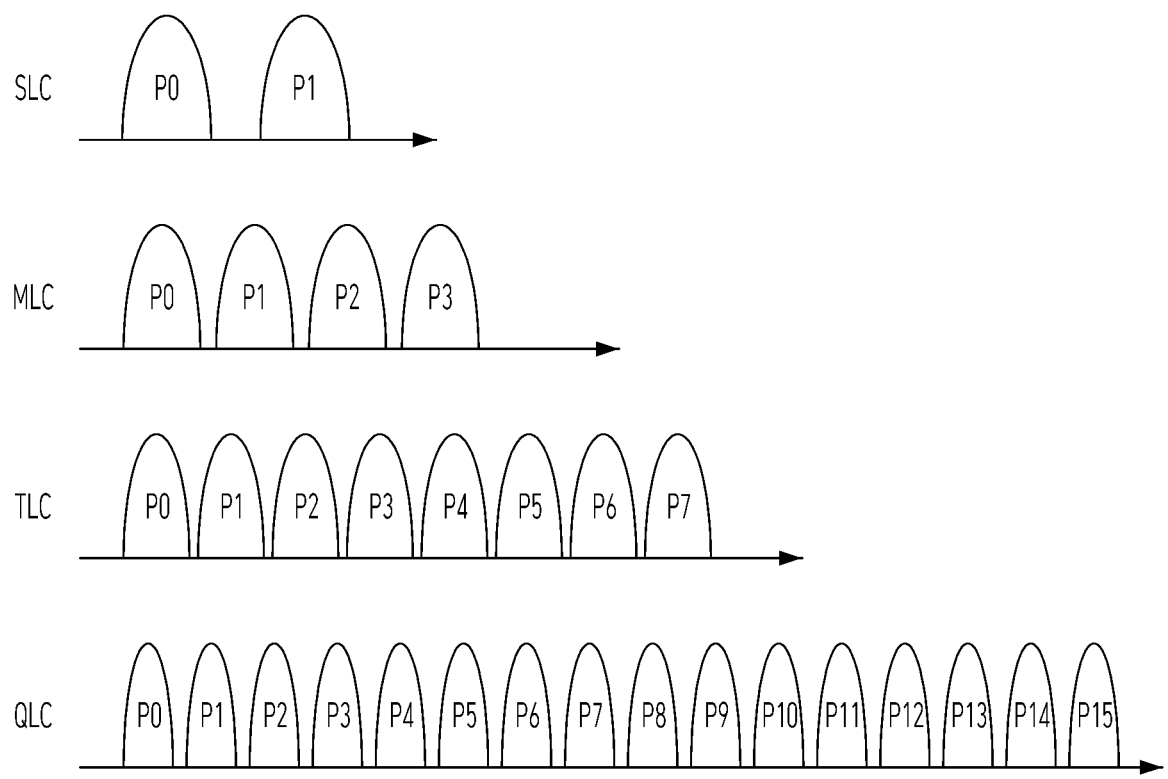
FIG. 4 is a diagram illustrating distributions of states for different types of cells of a memory device in accordance with another embodiment of the present invention.

FIG. 4 is a diagram illustrating distributions of states or program voltage (PV) levels for different types of cells of a memory device in accordance with an embodiment of the present invention.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
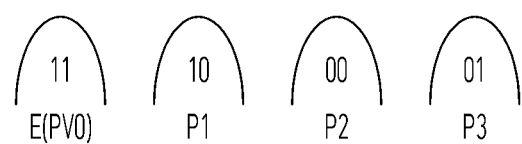
FIG. 5A is a diagram illustrating an example of Gray coding for a multi-level cell (MLC) in accordance with another embodiment of the present invention.

FIG. 5A is a diagram illustrating an example of coding for a multi-level cell (MLC) in accordance with an embodiment of the present invention.

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
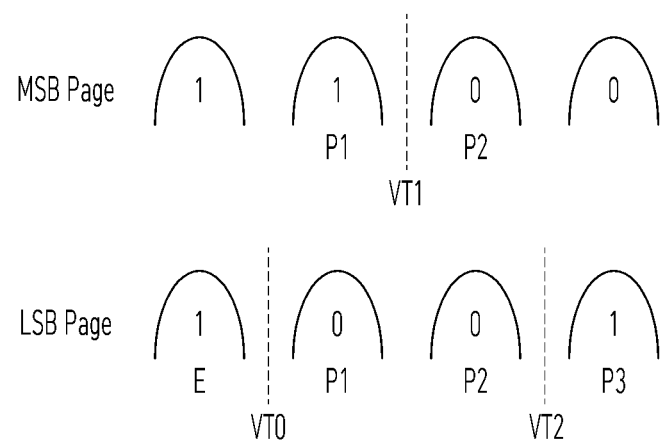
FIG. 5B is a diagram illustrating state distributions for pages of a multi-level cell (MLC) in accordance with another embodiment of the present invention.

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6:
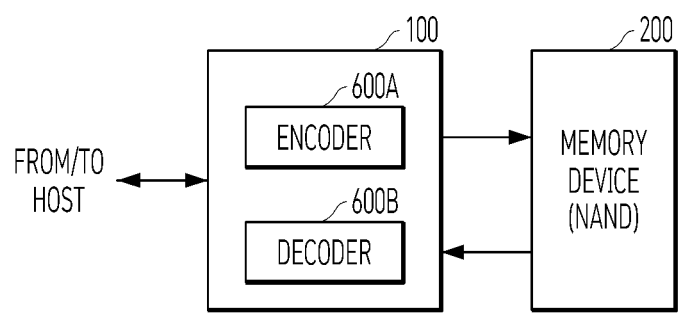
FIG. 6 is a diagram illustrating a memory system in accordance with another embodiment of the present invention.

FIG. 6 is a diagram illustrating a memory system in accordance with another embodiment of the present invention.

Referring to FIG. 6, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The controller 100 may include a processor (e.g., the control component 120 of FIG. 2) and a memory (e.g., the storage 110 of FIG. 2) including instructions stored thereupon, wherein the instructions upon execution by the processor cause the decoder 600B to perform the decoding operation. The controller 100 and the memory device 200 may include various other components as shown in FIG. 2 and perform the operations described in FIGS. 1 and 2. In an embodiment, the encoder 600A and decoder 600B may be embodied in the ECC component 130 of the controller 100 shown in FIG. 2. Other suitable arrangements may be employed as well, as described below. In general, the encoder 600A and decoder 600B may be implemented by hardware, software, firmware, or any suitable combination thereof.

Implementations of the decoder 600B may include a bit-flipping (BF) decoder and/or a min-sum (MS) decoder. The BF decoder has smaller gate counts (i.e., less area), consumes less power but has weaker error correction capability (i.e., lower precision). The MS decoder has higher gate counts, consumes higher power and can correct more errors than the BF decoder (i.e., higher precision). In an SSD, almost all of the performance may be coming from a BF decoder, instead of an MS decoder. The BF decoder is meant to converge fast for almost all traffic and only leaves a small percentage of traffic to the MS decoder. As a NAND flash memory becomes noisier when more layers are stacked and/or more bits per cell are introduced, a stronger correction in the MS decoder is desired. As a parity check matrix is often optimized for correction performance of the MS decoder, correction performance of the BF decoder might be significantly degraded. Accordingly, a BF decoder might not provide enough performance.

Figure 7:
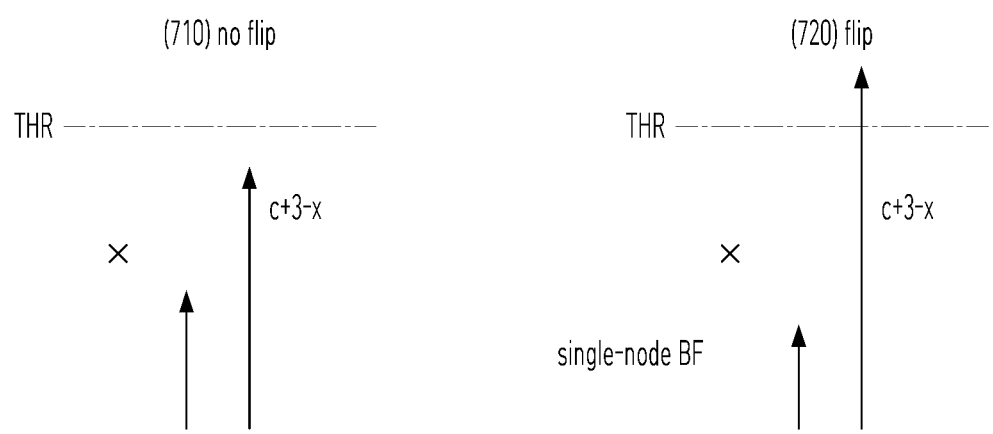
FIG. 7 illustrates a bit-flipping operation of a single node bit-flipping decoder.

In one embodiment, a BF decoder may flip each bit (i.e., single variable node) of a codeword. A flipping energy may be calculated to determine whether each bit of a codeword should be flipped. In one example, the flipping energy is calculated based on some features observed by a bit, e.g., channel input value, number of unsatisfied checks, etc. Then, the flipping energy is compared to a threshold THR as shown in FIG. 7. In FIG. 7, "x" represents the number of unsatisfied checks connecting to a variable node, and "c" represents the other terms contributing to total energy for the variable node. Here, the value "3" can be replaced with degree of the variable node. This example is for a variable node with degree 3. It is assumed that x=2 and degree=3. That means that the energy for this variable node is c+2. If this number is greater than the threshold THR, the BF algorithm will flip this variable node (720). However, flipping the bit changes the status of all the check nodes (CNs) connecting to this variable node. In this case, 2 unsatisfied CNs become satisfied, and the satisfied CN become unsatisfied. Thus, the energy changes from "c+2" to "c+3−2=c+1." If the flipping energy is less than or equal to the threshold THR, the bit value will not be flipped (710). Further, syndrome values on the checks that are connected to the bit will be updated.

In another example, the flipping energy for the i-th bit (i.e., variable node) is calculated by the following equation:

$$E(i)=\Sigma_{\{\forall j w/H(i,j)=1\}} s\_old(j)+(dec\_prev(i)!=chn(i)),$$

where s_old represents a syndrome value, dec_prev represents a current value of a variable node, and chn(i) represents a channel output value associated with a column. The syndrome value s_old may be a product of a noisy codeword and a parity check matrix. (dec_prev(i)!=chn(i)) represents a logical operation (i.e., an exclusive OR (XOR)) of the hard decision value dec_prev(i)! and the channel output value chn(i).

As such, in this embodiment, a flipping algorithm for a BF decoder is performed on a single bit (i.e., single node).

For an MS decoder, in order to obtain better correction performance, an irregular code can be used. For irregular codes, a column weight, or column degree, (or the number of non-zero elements in a column) can vary across different columns. The irregularity of a parity check matrix of an irregular low density parity check (LDPC) code can be described by the column weight distribution, which describes how non-zero bits are distributed with what column degree etc. An irregular code for an MS decoder having a high column degree typically leads to poor BF correction performance. For example, existing BF decoders do not work well with high degree nodes (e.g., degree 3 variable nodes).

In order to address this weakness of a BF decoder for irregular codes, embodiments of the present invention provide a BF decoder capable of improving the correction performance for optimized matrices for an MS decoder. A typical BF decoder (i.e., single node BF decoder) is weak on low degree nodes because there are not enough external connections that can provide sufficient amount of information for precise flipping energy calculations. Thus, the BF decoder of the present invention in one embodiment may treat multiple bits together as a super node and make a flipping decision for the whole super node together. Grouping multiple bits together improves the degree/connectivity from the super node to external nodes.

Figure 8:
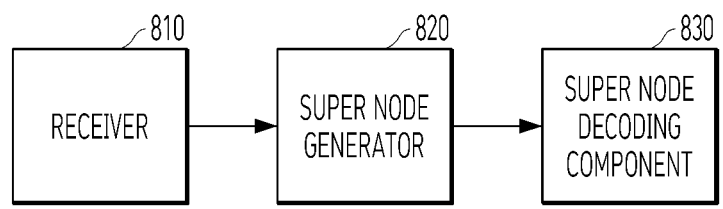
FIG. 8 is a diagram illustrating a super node bit-flipping (BF) decoder in accordance with another embodiment of the present invention.

FIG. 8 is a diagram illustrating a super node bit-flipping (BF) decoder 800 in accordance with one embodiment of the present invention.

Referring to FIG. 8, the super node BF decoder 800 may include a receiver 810, a super node generator 820 and a super node decoding component 830. The super node BF decoder 800 and its components may reside in ECC component 130 and/or control circuit 220. The receiver 810 may receive a codeword. In an embodiment, the codeword may have been generated based on a parity check matrix of a low-density parity-check (LDPC) code and which may have been provided to a communication channel prior to reception by the bit-flipping decoder 800.

The super node generator 820 may group two or more component nodes corresponding to two or more bits in the codeword to generate a super node. In some embodiments, the two or more component nodes include variable nodes with a low degree less than a set (or otherwise predetermined) degree (e.g., 5 degree).

The super node decoding component 830 may perform at least one decoding iteration on the super node. In some embodiments, the decoding iteration includes: calculating a flipping energy for the super node based on a) a flipping energy for each of the component nodes and b) internal checks between the component nodes; flipping the two or more bits in the super node upon a determination that the flipping energy for the super node exceeds a flipping threshold; updating, subsequent to the flipping, a syndrome as a product of the codeword and the parity check matrix; and declaring a success of the decoding iteration upon a determination that the syndrome is zero.

In some embodiments, the flipping energy for each of the component nodes is calculated based on, for each component node of a previous decoding iteration, a syndrome, a hard decision value and a channel output value. In one embodiment, the flipping energy for each of the component nodes is calculated based on, for each component node of a previous decoding iteration, a product of the syndrome and a logical operation of the hard decision value and the channel output value.

In some embodiments, the flipping threshold is determined based on a total degree of the super node and the number of channel inputs.

Upon a determination that the syndrome is not zero, the super node decoding component 830 may update the flipping threshold; and perform another decoding iteration based on the updated flipping threshold.

Figure 9:
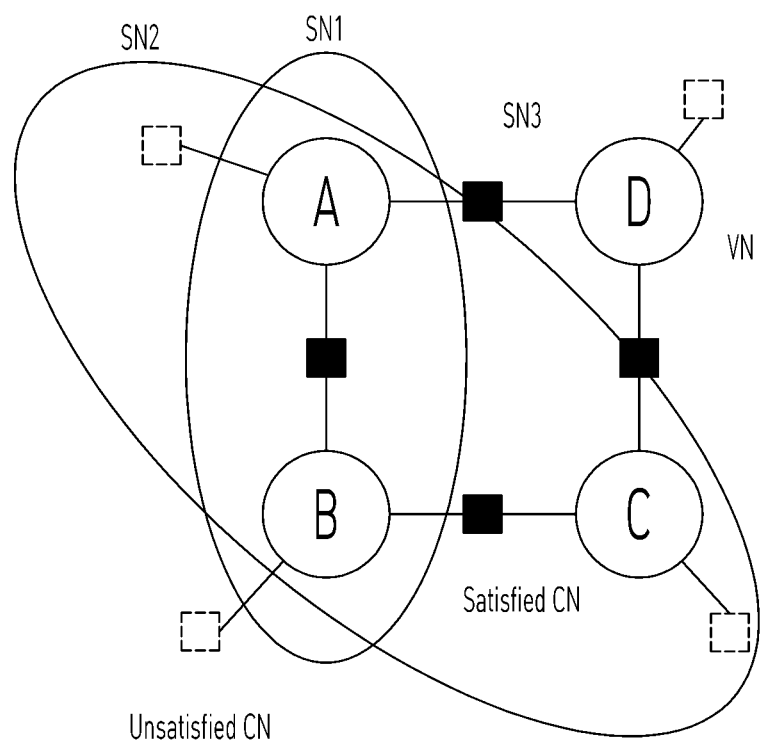
FIG. 9 illustrate an operation for generating a super node by a super node bit-flipping (BF) decoder in accordance with another embodiment of the present invention.

FIG. 9 illustrate an operation for generating a super node by a super node bit-flipping (BF) decoder in accordance with another embodiment of the present invention. In this embodiment, the super node may be generated by the super node generator 820 of FIG. 8.

Referring to FIG. 9, the super node generator 820 may group two or more component nodes corresponding to two or more bits in a codeword to generate a super node. For example, the super node generator 820 generates a super node SN1 by grouping two nodes corresponding to two bits A and B. For another example, the super node generator 820 generates a super node SN2 by grouping three nodes corresponding to three bits A, B and C. For another example, the super node generator 820 generates a super node SN3 by grouping four nodes corresponding to four bits A, B, C and D.

Here, the super node BF algorithm works better using the super node concept shown in FIG. 9. It is illustrated that all but 4 bits A, B, C and D (i.e., variable nodes (VNs)) are correct in a codeword. For example, nodes A, B, C, and D are all degree 3 nodes. Dotted boxes represent unsatisfied check nodes (CNs) and shaded boxes represent satisfied CNs. As shown in FIG. 9, the number of unsatisfied CNs for each variable node is 1. With reference to the List below, flipping energy E1 for each variable node is small.

Table 1 shows the flipping energy contribution from unsatisfied checks (i.e., USC contribution) for different BF algorithms with reference to the super node of FIG. 9. In Table 1, the symbol "x" represents incorrect bits A, B, C and/or D, i.e., that each variable node is in error, and the symbol "√" (checkmark) represents correct bits other than bits A, B, C and/or D, i.e., that each variable node is corrected.

TABLE 1

| Node | USC Contribution |
|---|---|
| A | x = 4 √ = 5 |
| AB (SN1) | xx = 4 √x = 5 x√ = 5 √√ = 4 |
| ABC (SN2) | xxx = 4 |
|  | xx√ = 5 √xx = 5 x√x = 5 |
|  | x√√ = 4 √x√ =6 √√x = 4 |
|  | √√√ = 3 |
| ABCD (SN3) | xxxx = 4 |
|  | ... |
|  | √√√√ = 0 |

For single bit (node) BF decoding for a node A, if the node A is set to be incorrect (i.e., x), the USC is equal to 4, whereas, if the node A is set to be correct (i.e., √), the USC is equal to 5. As can be seen from Table 1, the higher USC contribution "5" greater than a bit-flipping threshold may lead to bit-flipping. Thus, the higher USC contribution "5" tends to set the correct node A to be incorrect because of the higher energy for the correct node A (i.e., √).

For the super node SN1 including a group of two nodes A and B, there are the USC for all 4 possible configurations of A and B. As can be seen from Table 1, both correct-correct (√√) and incorrect-incorrect (xx) configurations gives USC of 4. This shows an improvement on correction because the lower USC contribution "4" reduces the probability of bit-flipping.

For the super node SN2 including a group of three nodes A, B and C, it can be seen that the all-correct configuration (√√√) is giving the lowest USC contribution "3".

For the super node SN3 including a group of four nodes A, B, C and D, it can be seen that the all-correct configuration (√√√√) is giving the lowest USC contribution "0". The lowest USC contributions indicate that the errors that the single node BF algorithm cannot correct can be corrected by 3 or 4 nodes based on the super node BF algorithm.

Figure 10:
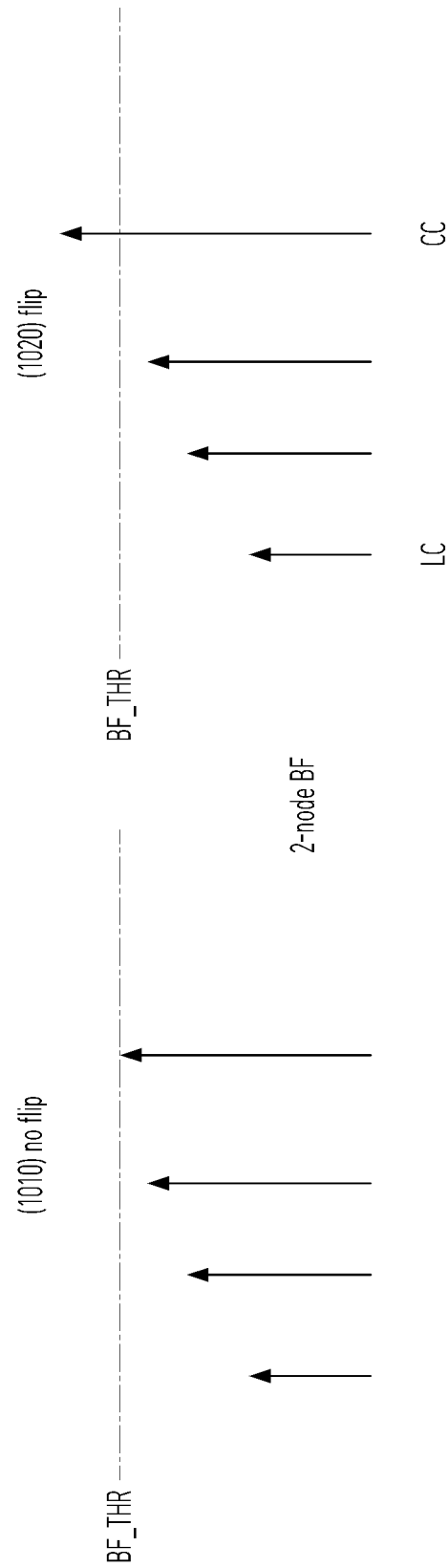
FIG. 10 illustrates a bit-flipping operation of a super node bit-flipping (BF) decoder in accordance with another embodiment of the present invention.

FIG. 10 illustrates a bit-flipping operation of a super node bit-flipping (BF) decoder in accordance with another embodiment of the present invention. In this embodiment, the bit-flipping operation may be performed by the super node decoding component 830 of the super node bit-flipping (BF) decoder 800 in FIG. 8.

In FIG. 10, the flipping energy per configuration (e.g., a super node including 2 bits) is first calculated based on the observation of syndrome bits, channel bits and the interconnection of internal bits. As shown at 1010 in FIG. 10, if the current configuration's flipping energy is less than or equal to a bit-flipping threshold BF_THR, there is no flipping to the super node. As shown at 1020 in FIG. 10, if the current configuration's flipping energy is greater than the bit-flipping threshold BF_THR, the current configuration CC will be bit-flipped to the configuration LC that has the lowest flipping energy.

FIG. 10 shows how the energy level which is a function of total number of unsatisfied check connecting to super node could change. FIG. 10 is extending the idea in FIG. 7 for single node energy. The simplest extension is to consider two variable nodes into one group. Therefore, embodiments can look at all the check nodes connecting to these two variable nodes, and try to compute the energy function. When the super node including more than one variable nodes, that means rather than (two states of "flip" and "no flip"), embodiments can have more states (for two VNs, the state can be "f-f", "f-nf", "nf-f", "nf-nf", where f denotes flip and nf denotes no flip). Therefore, the super node can change state from one status into another one based on energy of super node. 4 arrows of FIG. 10 show the level of energy for each one of these 4 levels. If BF for a super node decides to change the status of the super node, it will change from the highest energy arrow into the lowest energy arrow.

In some embodiments, the flipping energy for the super node including 2 nodes can be calculated as the following:

$$E(i1,i2)=\Sigma\_\{\forall jw/(H(i1,j)+H(i2,j)=1)\}s\_old(j)+\\(dec\_prev(i1)!=chn(i1))+(dec\_prev(i2)!=chn(i2))+(dec\_prev(i1)!=dec\_prev(i2)),$$

where s_old represents a syndrome value, dec_prev represents a current value of a variable node (component node), and chn(i) represents a channel output value associated with a column of a parity check matrix.

In some embodiments, the syndrome value s_old may be a product of a noisy codeword, and a parity check matrix. (dec_prev(i)!=chn(i)) represents a logical operation (i.e., an exclusive OR (XOR)) of the hard decision value dec_prev(i)! and the channel output value chn(i), for a previous decoding iteration.

The flipping energy of a super-node with k component binary nodes can be calculated based on the flipping energy of each single node and internal checks between the component binary nodes as the following:

$$E(i1,i2,i3,\ldots,ik)=sum\_all\_j(E(i\_j))-sum\_r((i\_r1==i\_r2)?1:0),$$

where i1, i2, . . . , ik represent binary values of k component nodes and r represents the index of all internal checks (i.e., check nodes). i_r1 and i_r2 represent the values of two binary component nodes which are connected by the r-th internal check. The flipping energy should be calculated for all possible combinations of bit values of i1 to ik if the flipping energy of a current configuration is greater than the bit-flipping threshold BF_THR.

In some embodiments, a bit-flipping threshold for a super node may be defined and optimized according to its total degree plus the number of channel inputs. For example, if a super node has 3 component binary nodes with degree 3 and 1 component binary node with degree 4, the total degree is 13 (=3×3+4). If the total degree is 13 and there are 4 channel input bits, the flipping threshold can be defined as an integer in the range of [0 . . . 17]. In some embodiments, values of the flipping energy below half of the maximum threshold value are unlikely to be useful as it may cause overly aggressive flipping behavior, and therefore may flip some of correct bits to become incorrect bits. That is, since the total degree is 13 and 4 channel input available (channel mismatch for each variable node, 4 VN in the super node SN3 of FIG. 9), the super node could get number 0 (when all the CNs are satisfied and all the channel information matches hard decision) all the way to total energy=13 (all CNs are unsatisfied)+4 (all channel info mismatch the hard decision) =17. Thus, the valid range of the flipping threshold is [0, 17].

For variable nodes with degrees higher than a certain degree (e.g., higher than degree 5), the single node BF algorithm may work well. Thus, in one embodiment of the present invention, the super node BF algorithm of the present invention may be only applied to the low degree variable nodes, and the single node BF algorithm may be applied to the high degree nodes.

In order to process low degree nodes, embodiments of the present invention may partition multiple bits (nodes) having a low degree into super nodes. This partition may leave some single nodes as leftover nodes. The super node BF can be applied to the super nodes defined by the partition above. There may be multiple ways to partition low degree nodes. One embodiment can apply different partitions in different iterations of the super node BF decoding procedure. The remaining nodes can be processed by the single node BF algorithm. At the first iteration and last iteration, embodiments may apply the single node BF algorithm to all variable nodes to satisfy the in-order processing requirement imposed by how data is fed into a decoder and how a cyclic redundancy check (CRC) is calculated and output data is sent out of the decoder. For example, if there are 10 decoding iterations, the single node BF algorithm may be performed at the first and last decoding iterations, and the super node BF algorithm may be performed for the remaining 8 decoding iterations among the 10 decoding iterations.

In some embodiments, a decoding operation of a super node bit-flipping (BF) decoder may be implemented with pseudo codes shown in the following List:

```
For iter=1:maxiter
  For supernode_index=1:SN
    Calculate flipping energy E1 of super-node(supernode_index) for current HD configuration.
    If E1>=flipping_threshold(super-node(supernode_index))
      Calculate flipping energy E2,...E2^k-1
      find minimum flipping energy as E_t
      Flip bit values [i1,i2,...ik] to [i1,i2,...ik]+bi(t) and update syndrome (bi(t) is the binary vector representation of t)
  For binarynode_index =1:BN
    Calculate flipping energy E1
    If E1>flipping_threshold(binarynode(binarynode_index))
    Flip the binary node and update syndrome
  If syndrome=0
    Declare decoding success and terminate
  Else
    If iter == maxiter
    Declare decoding failure
```

Referring to the List above, the decoding operation may be performed a set maximum number of decoding iterations (maxiter). When the syndrome value is zero (0), the decoding success is declared. When the decoding had not been succeeded until the maximum number of decoding iterations had been performed, the decoding failure is declared.

Based on the degree of variable nodes, a super node bit-flipping (BF) decoding operation ("For supernode_index=1:SN" in the List) or a single node BF decoding operation ("For binarynode_index=1:BN" in the List) may be performed. In one embodiment, for variable nodes with degrees less than a certain degree (e.g., higher than degree 5), the super node BF operation may be performed. For variable nodes with degrees greater than a certain degree (e.g., higher than degree 5), the single node BF operation may be performed.

The single node BF decoding operation may be performed according to a binary node index (binarynode_index=1:BN). When it is determined that the calculated flipping energy E1 is greater than a flipping threshold for the single node, the corresponding binary node (i.e., bit) is flipped and the syndrome value thereof is updated.

The super node BF decoding operation may be performed according to a super node index (supernode_index=1:SN). When it is determined that the calculated flipping energy E0 is greater than a flipping threshold for the super node, k bit values of the super node (i.e., [i1, i2, . . . ik]) are flipped to have values (i.e., [i1, i2, . . . ik]+bi(t)). Further, the syndrome value thereof is updated. Here, bi(t) represents the binary vector representation of t.

Referring back to FIG. 9, Table 1 and List, flipping for the single node A makes one of CNs satisfied, and creates two new unsatisfied CNs. Thus, checksum changes from 4 (number of total unsatisfied CNs) into 5. For the super node SN1 (A, B), flipping energy E2 is computed. Depending on the 4 possible states for (A, B), the checksum changes to 4 for (xx), 5 for (x√), 5 for (√x), and 4 for (√√). The flipping energy E2 is better than E1 since it does not encourage correcting the wrong VNs (A, B). It is better than E1, but it is not good enough. For the super node SN2 (A, B, C), flipping energy E4 is computed. Changing state from (xxx) to (√√√) is the best option since it reduces CS from 4 to 3. None of other possible changes reduce CS. For the super node SN3 (A, B, C, D), flipping energy E8 is computed (k=4 nodes, and $E\_\{2^{(k-1)}\}$). Changing state from (xxxx) to (cccc) is the best option since it reduces CS from 4 to 0. This is the best option.

Figure 11:
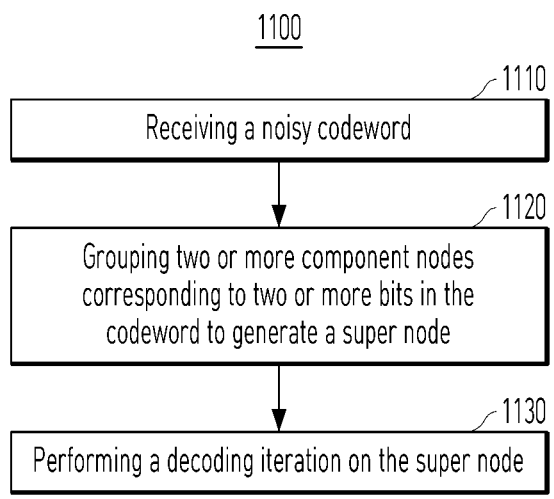
FIG. 11 is a flowchart illustrating an operation of a super node bit-flipping (BF) decoder in accordance with another embodiment of the present invention.

FIG. 11 is a flowchart illustrating an operation 1100 of a super node bit-flipping (BF) decoder in accordance with one embodiment of the present invention.

Referring to FIG. 11, the method 1100 includes, at operation 1110, receiving a codeword. In an embodiment, the codeword may have been generated based on a parity check matrix of a low-density parity-check (LDPC) code and may have been provided to a communication channel prior to reception by a bit-flipping decoder.

Operation 1120 includes grouping two or more component nodes corresponding to two or more bits in the codeword to generate a super node.

Operation 1130 includes performing a decoding iteration on the super node.

In some embodiments, the decoding iteration includes: calculating a flipping energy for the super node based on a flipping energy for each of the component nodes and internal checks between the component nodes; flipping the two or more bits in the super node upon a determination that the flipping energy for the super node exceeds a flipping threshold; updating, subsequent to the flipping, a syndrome as a product of the codeword and the parity check matrix; and declaring a success of the decoding iteration upon a determination that the syndrome is zero.

In some embodiments, the two or more component nodes include variable nodes having a low degree less than a set or predesignated degree.

In some embodiments, the flipping energy for each of the component nodes is calculated based on, for each component node of a previous decoding iteration, a syndrome, a hard decision value and a channel output value.

In some embodiments, the flipping energy for each of the component nodes is calculated based on, for each component node of a previous decoding iteration, a product of the syndrome and a logical operation of the hard decision value and the channel output value.

In some embodiments, the flipping threshold is determined based on a total degree of the super node and the number of channel inputs.

In some embodiments, the method 1100 may further include: upon a determination that the syndrome is not zero, updating the flipping threshold; and performing another decoding iteration based on the updated flipping threshold.

Figure 12:
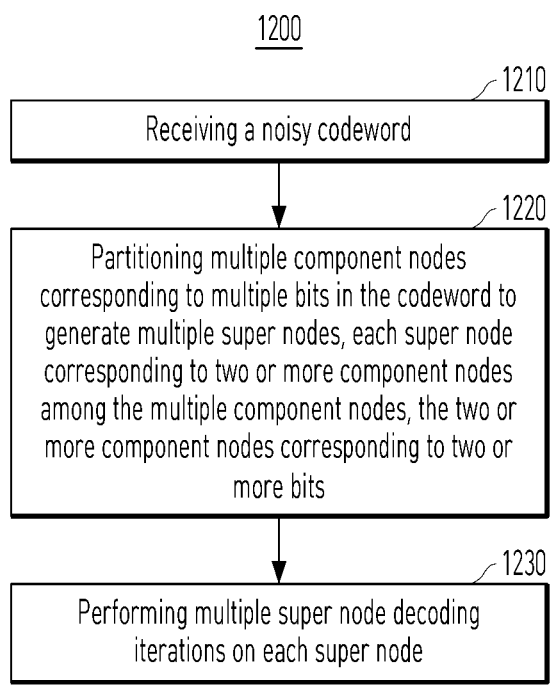
FIG. 12 is a flowchart illustrating an operation of a super node bit-flipping (BF) decoder in accordance with another embodiment of the present invention.

FIG. 12 is a flowchart illustrating an operation 1200 of a super node bit-flipping (BF) decoder in accordance with another embodiment of the present invention Referring to FIG. 12, the method 1200 includes, at operation 1210, receiving a codeword. In an embodiment, the codeword may have been generated based on a parity check matrix of a low-density parity-check (LDPC) code and may have been provided to a communication channel prior to reception by a bit-flipping decoder.

Operation 1220 includes partitioning multiple component nodes corresponding to multiple bits in the codeword to generate multiple super nodes, each super node corresponding to two or more component nodes among the multiple component nodes, the two or more component nodes corresponding to two or more bits.

Operation 1230 includes performing multiple super node decoding iterations on each super node. In some embodiments, each of the multiple super node decoding iterations includes: calculating a flipping energy for each super node based on a flipping energy for each of the two or more component nodes and internal checks between the two or more component nodes; flipping the two or more bits in each super node upon a determination that the flipping energy for each super node exceeds a flipping threshold; updating, subsequent to the flipping, a syndrome as a product of the codeword and the parity check matrix; and declaring a success of the decoding iteration upon a determination that the syndrome is zero.

In some embodiments, the two or more component nodes include variable nodes with a low degree less than a set or predesignated degree.

In some embodiments, the flipping energy for each of the two or more component nodes is calculated based on, for each component node of a previous decoding iteration, a syndrome, a hard decision value and a channel output value.

In some embodiments, the flipping energy for each of the two or more component nodes is calculated based on, for each component node of a previous decoding iteration, a product of the syndrome and a logical operation of the hard decision value and the channel output value.

In some embodiments, the flipping threshold is determined based on a total degree of each super node and the number of channel inputs.

In some embodiments, the method 1200 may further include: upon a determination that the syndrome is not zero, updating the flipping threshold; and performing another decoding iteration based on the updated flipping threshold.

In some embodiments, the multiple super nodes are differently partitioned to have different number of two or more component nodes, and the number of decoding iterations performed on the super nodes is different.

In some embodiments, the method 1200 may further include: determining whether one decoding iteration of the multiple decoding iterations is first and last decoding iterations; and when it is determined that the one decoding iteration is one of the first and last decoding iterations among of the multiple decoding iterations, performing a single decoding iteration for all component nodes.

In some embodiments, a decoding system may include a processor and a memory including instructions stored thereupon. The instructions upon execution by the processor cause a bit-flipping decoder to perform the operation 1100 of FIG. 11 or the operation 1200 of FIG. 12.

As described above, embodiments provide a BF decoding scheme based on a super node. This scheme improves the correction performance for optimized matrices for an MS decoder.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives. Furthermore, the embodiments may be combined to form additional embodiments.

What is claimed is:

1. A method of operating a bit-flipping decoder, comprising:
   receiving at a receiver of the bit-flipping decoder a codeword;
   grouping two or more component nodes corresponding to two or more bits in the codeword to generate a super node; and
   performing a decoding iteration on the super node containing the two or more component nodes grouped together,
   wherein the decoding iteration includes:
   calculating a flipping energy for the super node based on a flipping energy for each of the component nodes and internal checks between the component nodes;
   flipping at least one of the two or more bits in the super node containing the two or more component nodes grouped together upon a determination that the flipping energy for the super node exceeds a bit-flipping threshold;
   updating, subsequent to the flipping, a first syndrome as a product of the codeword and a parity check matrix; and
   declaring a success of the decoding iteration upon a determination that the first syndrome is zero.

2. The method of claim 1, wherein the two or more component nodes include variable nodes having a low degree less than a set degree.

3. The method of claim 1, wherein the flipping energy for each of the component nodes is calculated based on, for each component node of a previous decoding iteration, a second syndrome, a hard decision value and a channel output value.

4. The method of claim 3, wherein the flipping energy for each of the component nodes is calculated based on, for each component node of a previous decoding iteration, a product of the second syndrome and a logical operation of the hard decision value and the channel output value.

5. The method of claim 1, wherein the flipping threshold is determined based on a total degree of the super node and a number of channel inputs.

6. The method of claim 1, further comprising:
   upon a determination that the first syndrome is not zero, updating the flipping threshold; and
   performing another decoding iteration based on the updated flipping threshold.

7. A method of operating a bit-flipping decoder, comprising:
   receiving at a receiver of the bit-flipping decoder a codeword;
   partitioning multiple component nodes corresponding to multiple bits in the codeword to generate multiple super nodes, each super node corresponding to two or more component nodes among the multiple component nodes, the two or more component nodes corresponding to two or more bits; and
   performing multiple super node decoding iterations on each super node containing the two or more component nodes grouped together,
   wherein each of the multiple super node decoding iterations includes:
   calculating a flipping energy for each super node based on a flipping energy for each of the two or more component nodes and internal checks between the two or more component nodes;
   flipping at least one of the two or more bits in each super node containing the two or more component nodes grouped together upon a determination that the flipping energy for each super node exceeds a bit-flipping threshold;
   updating, subsequent to the flipping, a first syndrome as a product of the codeword and a parity check matrix; and
   declaring a success of the decoding iteration upon a determination that the first syndrome is zero.

8. The method of claim 7, wherein each of the two or more component nodes in the multiple super nodes includes variable nodes with a low degree less than a set degree.

9. The method of claim 7, wherein the flipping energy for each of the two or more component nodes is calculated based on, for each component node of a previous decoding iteration, a second syndrome, a hard decision value and a channel output value.

10. The method of claim 9, wherein the flipping energy for each of the two or more component nodes is calculated based on, for each component node of a previous decoding iteration, a product of the second syndrome and a logical operation of the hard decision value and the channel output value.

11. The method of claim 7, wherein the flipping threshold is determined based on a total degree of each super node and a number of channel inputs.

12. The method of claim 7, further comprising:
   upon a determination that the first syndrome is not zero, updating the flipping threshold; and
   performing another decoding iteration based on the updated flipping threshold.

13. The method of claim 7, wherein the multiple super nodes are differently partitioned to have different number of two or more component nodes, and a number of decoding iterations performed on the super nodes is different.

14. The method of claim 7, further comprising:
   determining whether one decoding iteration of the multiple decoding iterations is one of first and last decoding iterations; and when it is determined that the one decoding iteration is either of the first and last decoding iterations among of the multiple decoding iterations, performing a single decoding iteration for all component nodes.

15. A decoding system comprising:

a processor and a memory including instructions stored thereupon, wherein the instructions upon execution by the processor cause a bit-flipping decoder to:

receive at a receiver of the bit-flipping decoder a codeword;

group two or more component nodes corresponding to two or more bits in the codeword to generate a super node; and perform a decoding iteration on the super node containing the two or more component nodes grouped together, wherein the decoding iteration includes:

calculating a flipping energy for the super node based on a flipping energy for each of the component nodes and internal checks between the component nodes;

flipping at least one of the two or more bits in the super node containing the two or more component nodes grouped together upon a determination that the flipping energy for the super node exceeds a bit-flipping threshold;

updating, subsequent to the flipping, a first syndrome as a product of the codeword and a parity check matrix; and declaring a success of the decoding iteration upon a determination that the first syndrome is zero.

16. The decoding system of claim 15, wherein the two or more component nodes include variable nodes with a low degree less than a set degree.

17. The decoding system of claim 15, wherein the flipping energy for each of the component nodes is calculated based on, for each component node of a previous decoding iteration, a second syndrome, a hard decision value and a channel output value.

18. The decoding system of claim 17, wherein the flipping energy for each of the component nodes is calculated based on, for each component node of a previous decoding iteration, a product of the second syndrome and a logical operation of the hard decision value and the channel output value.

19. The decoding system of claim 15, wherein the flipping threshold is determined based on a total degree of the super node and a number of channel inputs.

20. The decoding system of claim 15, wherein the bit-flipping decoder is configured to perform, upon a determination that the first syndrome is not zero, updating the flipping threshold; and performing another decoding iteration based on the updated flipping threshold.

* * * * *